United States Patent [19]
Lee

[11] Patent Number: 5,497,393
[45] Date of Patent: Mar. 5, 1996

[54] SEMICONDUCTOR LASER WITH SUPER STRUCTURE GRATING DISTRIBUTED BRAGG REFLECTOR

[75] Inventor: Kyu-Seok Lee, Daejeon, Rep. of Korea

[73] Assignee: Electronics & Telecommunications Research Institute, Daejeon, Rep. of Korea

[21] Appl. No.: 359,186

[22] Filed: Dec. 19, 1994

[30] Foreign Application Priority Data

Dec. 9, 1994 [KR] Rep. of Korea .................. 94-33468

[51] Int. Cl.⁶ .................................................. H01S 3/10
[52] U.S. Cl. ........................ 372/96; 372/102; 372/20; 372/50
[58] Field of Search ........................... 372/96, 99, 102, 372/50, 18, 20

[56] References Cited

U.S. PATENT DOCUMENTS

| | | | |
|---|---|---|---|
| 3,970,959 | 7/1976 | Wang et al. | 372/96 |
| 4,464,762 | 8/1984 | Furuya | 372/50 |
| 4,905,253 | 2/1990 | Chraplyvy et al. | 372/96 |
| 5,091,916 | 2/1992 | Cimini, Jr. et al. | 372/96 |
| 5,325,392 | 6/1994 | Tohmori et al. | 372/96 |
| 5,357,538 | 10/1994 | Talneau et al. | 372/96 |
| 5,379,318 | 1/1995 | Weber | 372/96 |

OTHER PUBLICATIONS

Arahira et al, "Transform–Limited Optical Short–Pulse Generation at High Repetition Rate Over 40 GHz from a monolithic Passive Mode–Locked DBR Laser Diode", IEEE Phot. Tech. Lett., vol. 5, No. 12, Dec. 1993, pp. 1362–1365.
Jayaraman et al, "Extended Tuning Range in Sampled Grating DBR Lasers", IEEE Phot. Tech. Lett., vol. 5, No. 5, May 1993, pp. 489–491.

*Primary Examiner*—Rodney B. Bovernick
*Assistant Examiner*—Hemang Sanghavi
*Attorney, Agent, or Firm*—Antonelli, Terry, Stout & Kraus

[57] ABSTRACT

Disclosed is a semiconductor laser with a super structure grating DBR capable of generating a pulse train of from several hundred giga Hz to several tera Hz, comprising a saturable absorber section, a gain section, a phase control section and an super structure grating distributed Bragg reflector section, the Bragg reflector section having at least five sampling periods, each of the sampling periods having grating pitches of 233.5 nm, 235 nm, 236.5 nm, 238 nm and 239.5 nm, and said grating pitches being arranged corresponding to wavelengths of 5837.5 nm, 1175 nm, 5912.5 nm, 1195 nm and 5987.5 nm, respectively.

1 Claim, 2 Drawing Sheets schematic structure of integrated SSG-DBR laser a SSG-DBR with 5 sampling periods ($425\lambda/2n$)

SEMICONDUCTOR LASER WITH SUPER STRUCTURE GRATING DISTRIBUTED BRAGG REFLECTOR

BACKGROUND OF THE INVENTION

1. Field of the Invention

The present invention relates to a semiconductor laser with a distributed Bragg reflector (hereinafter, referred to as "DBR") having an oscillating wavelength of 1.55 μm, and more particularly to a semiconductor laser with a super structure grating (hereinafter, referred to as "SSG") DBR capable of generating a pulse train of from several hundred GHz (Giga Hertz) to several THz (Tera Hertz).

2. Description of the Prior Art

From a pulse generating semiconductor laser functioning as a light source of an optical communication network or an optical memory device, to generate a stable pulse train having a high repetition rate, it is profitable to use an integrated cavity semiconductor laser constituted by four main sections: a saturable absorber section, a gain section, a phase control section and a DBR section. In this laser, when a current signal greater than a threshold oscillation current necessary for operation thereof is applied thereto, a pulse train is generated by a harmonic passive mode locking (disclosed by S. Arahira et. al., IEEE Photon. Technol. Lett. 5, 1362, 1993).

A reflection factor of a limited length is vibrated in accordance with a wavelength, and thereby the harmonic passive mode locking occurs around a main oscillation wavelength.

It has been disclosed that a DBR structure using a grating plate having repetition rate of 120 μm is used as one of DBR structures as well-known in the art. In the DBR structure, if the reflection factor is deviated by about 5 nm from a main oscillation wavelength (1560 nm), the amplitude of the oscillation curve is reduced about a half. Then, during occurrence of the harmonic passive mode locking, it is difficult to obtain a stable pulse train having an average output of several tens meW. The DBR having the above-mentioned characteristics is not preferably to apply to an ultrafast information communication network system.

SUMMARY OF THE INVENTION

It is an object of the present invention to provide a semiconductor laser with a super structure grating distributed Bragg reflector, in which a stable pulse train having a repetition rate of several THz is generated so as to be used as a light source of a ultrafast information communication network or a high-speed optical device.

According to the aspect of the present invention, the semiconductor laser with a distributed Bragg reflector having a saturable absorber section, a gain section, a phase control section and an super structure grating distributed Bragg reflector section, said Bragg reflector section having at least five sampling periods, each of the sampling periods having grating pitches of 233.5 nm, 235 nm, 236.5 nm, 238 nm and 239.5 nm, and the grating pitches being arranged corresponding to wavelengths of 5837.5 nm, 1175 nm, 5912.5 nm, 1195 nm and 5987.5 nm, respectively.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
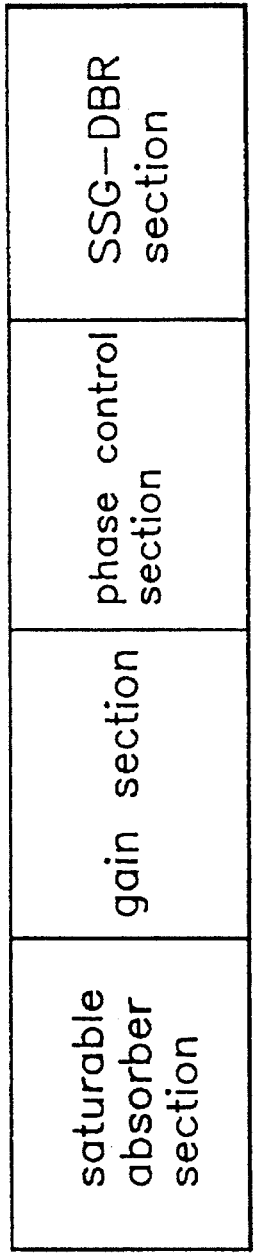
FIG. 1 is a block diagram showing a schematic structure of the semiconductor laser with a DBR according to the present invention.

Referring to FIG. 1, similarly to the prior art semiconductor laser, the semiconductor laser of the present invention comprises four sections: a saturable absorber section, a gain section, a phase control section and an SSG-DBR section.

Both gain and absorber Sections consist of three compressively strained InGaAs quantum wells separated by an inGaAsP barriers. An InGaAsP is used for the waveguides of the phase control and the SSG-DBR sections. The output light is provided from the SSG-DBR section.

Figure 2:
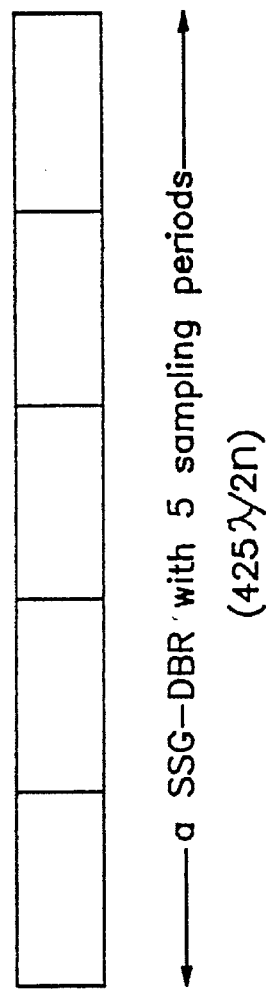
FIG. 2 is a block diagram showing five sampling periods of the SSG-DBR of FIG. 1.

The SSG-DBR section is constituted by five sampling periods, as shown in FIG. 2, and has an effective phase refractive index of 3.28. Also, the SSG-DBR section may be constituted by six sampling periods.

Figure 3:
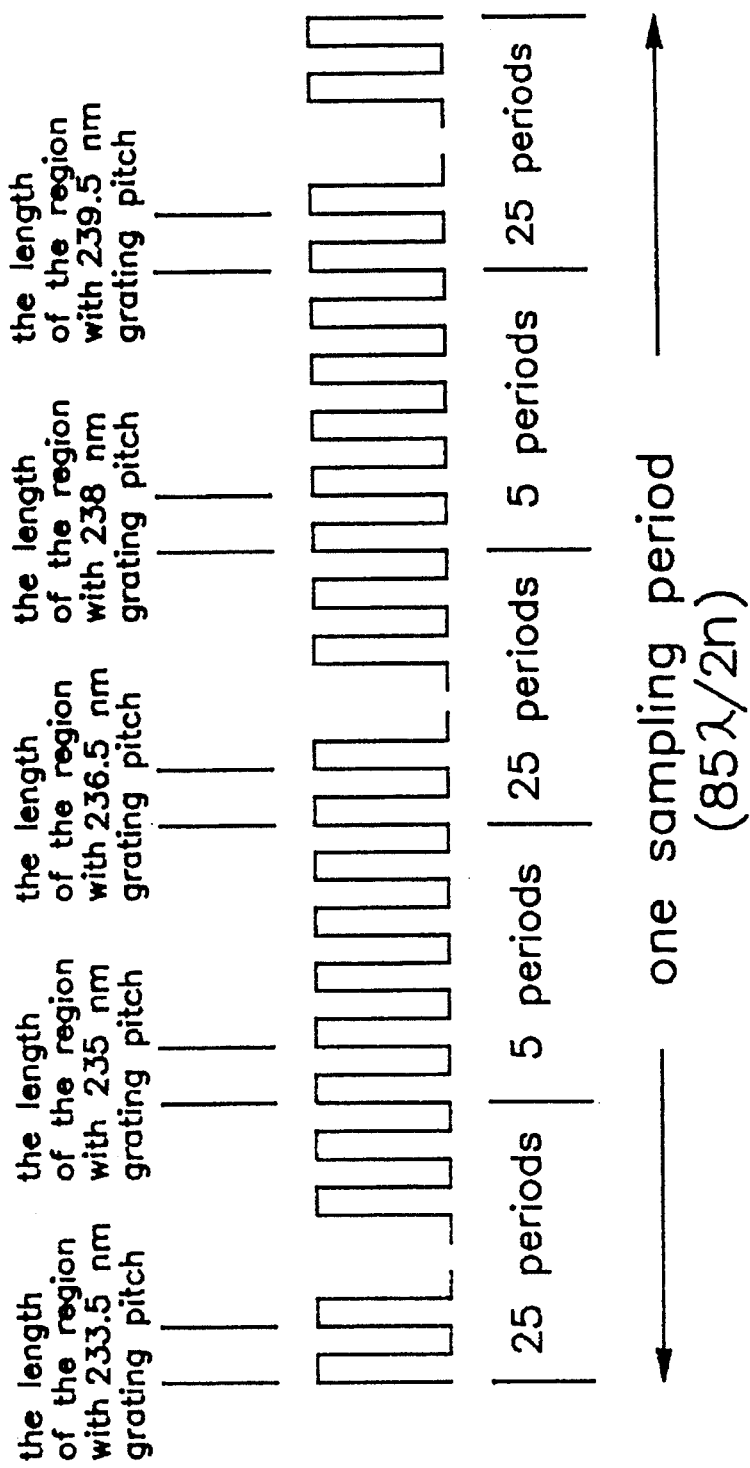
FIG. 3 is a diagram showing one of the five sampling periods of FIG. 2.

In each of the sampling periods of FIG. 2, as shown in FIG. 3, the length of the region with 233.5 nm, 235 nm, 236.5 nm, 238 nm and 239.5 nm grating pitch corresponds to wavelengths of 5837.5 nm, 1175 nm, 5912.5 nm, 1195 nm and 5987.5 nm, respectively. Because the width of each sampling period is 20.1 μm, total width of the SSG-DBR section having the five sampling periods becomes 100.5 μm. If the SSG-DBR section has six sampling periods, the total width thereof becomes 120.6 μm.

In the semiconductor laser having the SSG-DBR, a maximum value of reflection peaks separated by about 4.9 nm exists at wavelength of about 40 nm around the range of from 1.531 to 1.571 μm. Since the length of each reflection peak is similarly, a stable harmonic passive mode locking occurs having a repetition rate several times greater than a basic repetition rate of about 610 GHz.

Also, in the semiconductor laser having the SSG-DBR, a pulse train having an average output of 10 mW or more can be generated.

Therefore, according to the semiconductor laser having the SSG-DBR section, when a pulse train of 1.55 μm wavelength is generated having a repetition rate of 1 tera Hz or more, it is possible to generate the stable train, as compared to the pulse train generated by a prior art semiconductor laser.

In addition, the pulse train generated thus is high in an average output.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A semiconductor laser with a distributed Bragg reflector having a saturable absorber section, a gain section, a phase control section and an super structure grating distributed Bragg reflector section,
said Bragg reflector section having at least five sampling periods, each of the sampling periods having grating pitches of 233.5 nm, 235 nm, 236.5 nm, 238 nm and 239.5 nm, and
said grating pitches being arranged corresponding to wavelengths of 5837.5 nm, 1175 nm, 5912.5 nm, 1195 nm and 5987.5 nm, respectively.

* * * * *